(12) United States Patent
Laplaca

(10) Patent No.: US 9,236,839 B2
(45) Date of Patent: Jan. 12, 2016

(54) CLASS-G AMPLIFIER AND AUDIO SYSTEM EMPLOYING THE AMPLIFIER

(71) Applicant: STMicroelectronics S.r.l., Agrate Brianza (IT)

(72) Inventor: Michele Laplaca, Cefalu' (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 265 days.

(21) Appl. No.: 14/018,291

(22) Filed: Sep. 4, 2013

(65) Prior Publication Data
US 2014/0093104 A1    Apr. 3, 2014

(30) Foreign Application Priority Data
Sep. 28, 2012  (IT) .................. MI12A1624

(51) Int. Cl.
*H03F 3/26* (2006.01)
*H03F 3/18* (2006.01)
*H03F 1/02* (2006.01)
*H03F 3/21* (2006.01)
*H03F 3/30* (2006.01)

(52) U.S. Cl.
CPC ............ *H03F 3/26* (2013.01); *H03F 1/0244* (2013.01); *H03F 1/0277* (2013.01); *H03F 3/211* (2013.01); *H03F 3/3066* (2013.01)

(58) Field of Classification Search
USPC ......................................... 330/263, 267, 255
See application file for complete search history.

(56) References Cited

U.S. PATENT DOCUMENTS

| 4,531,099 A | 7/1985 | Nakane |
| 6,107,886 A | 8/2000 | Kusakabe |
| 6,982,600 B2 * | 1/2006 | Harvey .................. 330/263 |
| 2002/0005759 A1 | 1/2002 | Wong |

FOREIGN PATENT DOCUMENTS

GB    2307609 A    5/1997

OTHER PUBLICATIONS

Italian Search Report and Written Opinion dated Apr. 18, 2013 from corresponding Italian Patent Application No. MI2012A001624.

* cited by examiner

*Primary Examiner* — Hieu Nguyen
(74) *Attorney, Agent, or Firm* — Allen, Dyer, Doppelt, Milbrath & Gilchrist, P.A.

(57) ABSTRACT

A Class-G amplifier including a first and second driving transistor configured to receive an input voltage; a first supplying terminal connected to the first driving transistor to supply a first supplying voltage. The amplifier also comprises: a second supplying terminal connected to the second driving transistor to supply a second supplying voltage in absolute value higher than said first voltage; a first power transistor connected to the first driving transistor to form a first Sziklai pair structured to be activated by a first input voltage lower in absolute value than the first supplying voltage; a second power transistor connected to the second driving transistor to form a second Sziklai pair structured to be activated by an input signal comprised between the first supplying voltage and the second supplying voltage.

20 Claims, 3 Drawing Sheets ated in comparison with that of an amplifier working as a Class-B and/or Class-AB amplifier, in particular with signals with high crest factor, like audio signals, which extend around zero for most of the time, with few excursions at high level.

CLASS-G AMPLIFIER AND AUDIO SYSTEM EMPLOYING THE AMPLIFIER

CROSS REFERENCE TO RELATED APPLICATIONS

This application claims the priority benefit of Italian patent application serial number MI2012A001624, filed Sep. 28, 2012, which is hereby incorporated by reference to the maximum extent allowable by law.

BACKGROUND

1. Technical Field

The present disclosure refers to Class-G power amplifiers, and more particularly, to an output stage for Class-G power amplifiers. The present description further refers to an audio amplifier system.

2. Discussion of the Related Art

Class-G power amplifiers are known, made of one or more output stages supplied with different voltages, the activation of which dynamically occurs, in conformity with the amplitude of the input signal.

In Class-G power amplifiers, the signal is amplified from the stage supplied to a voltage immediately greater than the instantaneous amplitude of the input signal itself, so as to minimize the voltage drop in the output stage, when it draws the load current.

A reduced power dissipation and a greater power efficiency are obtained in comparison with that of an amplifier working as a Class-B and/or Class-AB amplifier, in particular with signals with high crest factor, like audio signals, which extend around zero for most of the time, with few excursions at high level.

Some useful considerations regarding the performance of Class-G amplifiers are shown in following documents:

F. H. Raab—Average Efficiency of Class-G Power Amplifiers—IEEE Transactions on Consumer Electronics, Vol. CE-32, No. 2, May 1986;

R. van der Zee, "High Efficiency Audio Power Amplifiers: Design and Practical Use" 1999 available Online at the address: www.ub.utwente.nl/webdocs/el/1/t000000d.pdf The power stages of the Class-G amplifier are configured according to two basic topologies: the stacked (serial) topology and the shunt (parallel) topology.

Some examples of power stages for Class-G amplifiers, with stacked topology, are described in documents U.S. Pat. No. 3,961,280 and U.S. Pat. No. 3,772,606.

Some examples of power stages for Class-G amplifiers with shunt topology, are described in following documents:

D. H. Horrocks—Active filter power dissipation reduction using improved output stage—Digital and Analog Filters and Filtering Systems, IEE Colloquium on, 25 May 1990;

D. Self—Audio Power Amplifier Design Handbook—News, Chapter 10.

With reference to D. H. Horroks documents cited before, they describe one shunt-topology Class-G amplifier (FIG. 1(a)) and one with stacked topology (FIG. 1(b)), each having two BJT Class-B stages. In such document two symmetrical supplies are made: one first voltage having a lower value, ±VL, and one second voltage having a greater value, ±VH. The first Class-B stage has two transistors (Q1 and Q2) with a push-pull configurations, which are supplied by the lower voltages ±VL and the second Class-B stage is provided with other two transistors with a push-pull configuration (Q3 and Q4) supplied by the greater voltages ±VH.

During the operation of the amplifiers described in the article of D. H. Horroks when the amplitude of the input signal is lower than a ±VL value, the current to be supplied to a load is generated by those transistors (Q1 and Q2) which are supplied by the lower voltage ±VL. When the amplitude of the input signal further increases, the electric current at the load is supplied after a switching phase, by the transistors Q3 and Q4 supplied by the greater voltages ±VH. In particular, for the shunt topology the transistors Q1 and Q2 are turned off when the transistors Q3 and Q4 are in operation, whereas for the stacked topology, the transistors Q1 and Q2 remain powered and are isolated from lower supplies ±VL by means of diodes.

Class-G amplifiers of the known type have a problem which has limited their use in audio "high fidelity" applications: such problem being the distortion of the waveform at the switching among the various amplifier stages, also known as "switching noise".

Such switching noise is particularly present at high frequencies from the audio-band, as noted in document of T. Sampei at al.—Highest efficiency and super quality audio amplifier using MOS power fets in class G operation—IEEE Transactions on Consumer Electronics, Vol. CE-24, No. 3, August 1978. Such document proposes the use of MOSFET-type power transistors.

SUMMARY

The Applicant has noted that it is possible to reduce the problem of the switching noise, typical of Class-G amplifiers of the known art, by adopting an output stage which comprises driving transistors and power transistors, connected in order to form Sziklai pairs.

According to one embodiment, there is provided a Class-G amplifier, including a first and second driving transistor configured to receive an input voltage, a first supplying terminal connected to the first driving transistor to supply a first supplying voltage, a second supplying terminal connected to the second driving transistor to supply a second supplying voltage having an absolute value higher than said first voltage, a first power transistor connected to the first driving transistor to form a first Sziklai pair structured to be activated by a first input voltage having an absolute value lower than the first supplying voltage, and a second power transistor connected to the second driving transistor to form a second Sziklai pair structured to be activated by an input signal comprised between the first supplying voltage and the second supplying voltage.

According to another embodiment, the amplifier includes a first regulating resistor having a first regulating resistance and connected to said first Sziklai pair so that a first activation threshold of the first Sziklai pair is dependent from said first resistance, a second regulating transistor having a second regulating resistance lower than said first regulating resistance and connected to said second Sziklai pair so that a second activation threshold of the second Sziklai pair is dependent from said second resistance, and an output terminal for an output signal related to said input signal and electrically connected to a corresponding terminal of said collector of said first power transistor and of said second power transistor.

According to another embodiment, the first regulating resistor is connected between a base terminal and an emitter terminal of said first power transistor, and the second regulating transistor is connected between a base terminal and an emitter terminal of said second power transistor.

According to another embodiment, a first degeneration resistor is connected between an emitter terminal of said first driving transistor and said output terminal, and a second degeneration resistor is connected between an emitter terminal of said second driving transistor and said output terminal.

According to another embodiment, a clamping circuit is connected between the first supplying terminal and said first regulating resistor.

According to another embodiment, the clamping circuit includes a first supplying diode having a first diode terminal connected to the first supplying terminal and a second diode terminal connected to the first regulating resistor.

According to another embodiment, said first diode is a Schottky diode.

According to another embodiment, the first power transistor has a corresponding collector terminal connected to the output terminal, and the first driving transistor has a corresponding collector terminal connected to the base terminal of the first power transistor.

According to another embodiment, the amplifier includes a pre-driving stage configured to receive a voltage to amplify and to supply such input voltage.

According to another embodiment, the first driving transistor is of Class-B and the second power transistor is of Class-B.

According to another embodiment, the amplifier includes a second driving transistor connected to the first driving transistor in a push-pull configuration, and a second power transistor connected to the first power transistor in a push-pull configuration.

According to another embodiment, the amplifier includes a pre-amplifier module structured to receive a signal to be amplified and to supply said input signal.

According to another embodiment, the driving and power transistors are bipolar transistors.

According to another embodiment, the amplifier is configured so that said input voltage corresponds to an audio electric signal.

According to another embodiment, there is provided a loudspeaker provided with an input for an amplified electric signal, a Class-G amplifier configured to supply said amplified electric signal, including a first and second driving transistor configured to receive an input voltage, a first supplying terminal connected to the first driving transistor to supply a first supplying voltage, a second supplying terminal connected to the second driving transistor to supply a second supplying voltage having an absolute greater value than said first voltage, a first power transistor connected to the first driving transistor to form a first Sziklai pair structured to be activated by an input voltage having an absolute value lower than the first supplying voltage, a second power transistor connected to the second driving transistor to form a second Sziklai pair structured to be activated by an input signal comprised between the first supplying voltage and the second supplying voltage.

BRIEF DESCRIPTION OF THE DRAWINGS

Some exemplary and non limitative embodiments will be described, with reference to annexed figures, in which.

DETAILED DESCRIPTION

Figure 1:
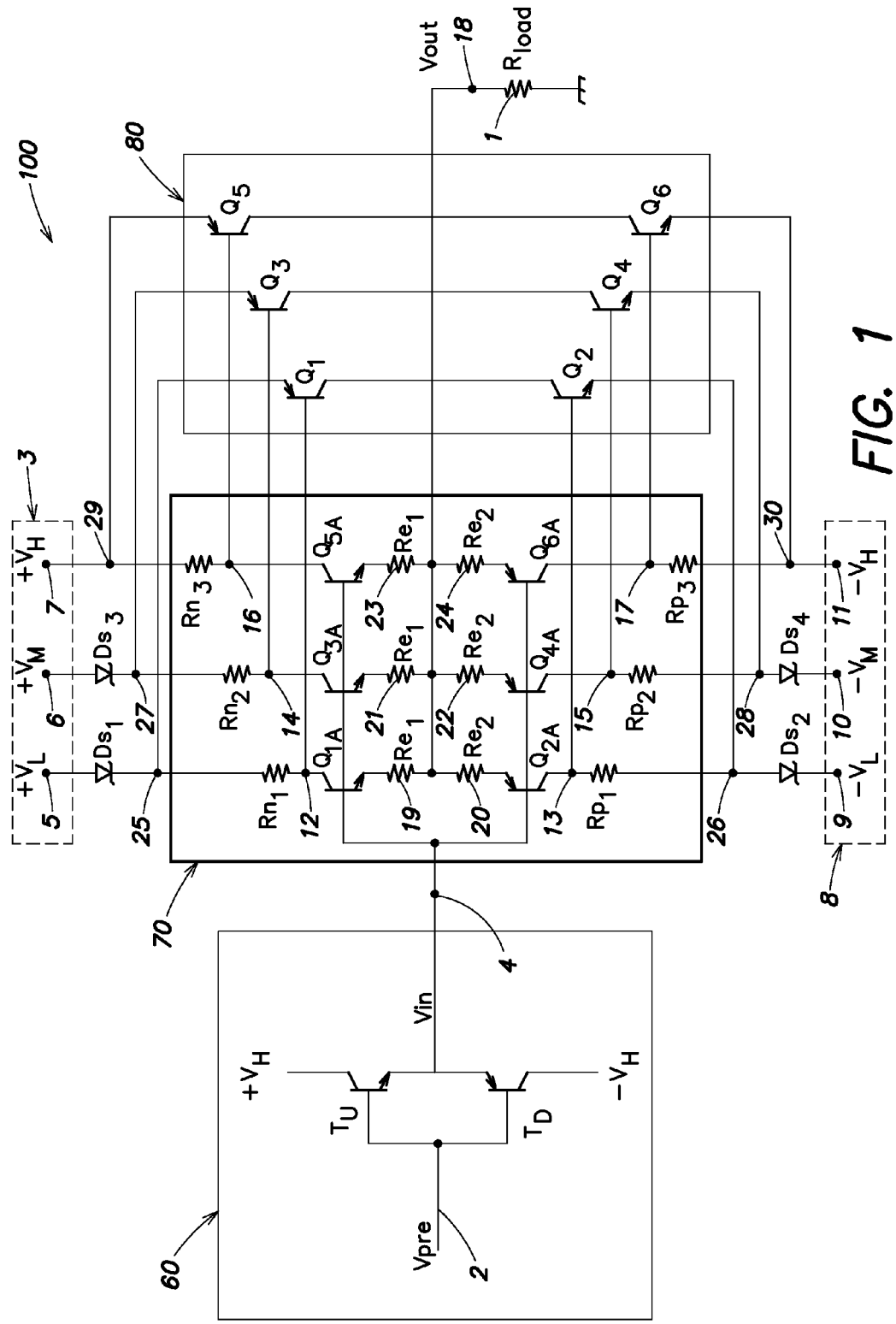
FIG. 1 schematically shows an audio system comprising an example of a Class-G amplifier, connected to an electrical load.

FIG. 1 shows an exemplary embodiment of an audio system 1000 comprising a Class-G amplifier 100 and an electrical load 1, like a loudspeaker. The teachings of the present description can be applied also to Class-G amplifiers not used for audio signals.

The amplifier 100 shown in figure is of the type with shunt (parallel) topology and with a complementary symmetry. In the example of FIG. 1, three parallel stages are represented, each of B-Class, but the amplifier 100 can also comprise a different number of stages.

The amplifier 100 comprises a driving module 70, a first plurality of supplying terminals 3 and a power module 80, which can be connected to the electrical load 1 at the outside of the amplifier 100, and having resistance Rload. In particular, the amplifier 100 is provided with a pre-driving module 60 comprising a first input terminal 2 for a first input terminal Vpre, like a signal under a voltage. The first input terminal 2 is connected to a pre-driving circuit comprising an upper transistor TU and a lower transistor TD, both of the bipolar type (BJT, Bipolar Junction Transistor) connected in a push-pull configuration.

In the particular case shown, the upper transistor TU is of NPN type, whereas the lower transistor TD is of PNP type. The upper transistor TU has its own collector terminal connected to a supplying terminal of a positive voltage (+VH), a base terminal of its own connected to the first input terminal 2 and an emitting terminal of its own connected to a second input terminal 4, in order to supply a second input signal Vin to the driving module 70.

The lower transistor TD has a collector terminal of its own, connected to a supplying terminal of a negative voltage (−VH), a base terminal of its own connected to the first input terminal 2 and an emitting terminal of its own connected to the second input terminal 4, in order to supply the second input signal Vin to the driving module 70.

The pre-driving module 60 is configured to operate as a Class-B amplifier and the upper transistor TU is active for positive values of the first input signal Vpre, whereas the lower transistor TD is active for negative values of the first input signal Vpre.

The first plurality of supply terminals 3 comprises, in the example, a first supply terminal 5 for a first supply voltage VL, a second supply terminal 6 for a second supply positive voltage VM and a third supply terminal 7 for a third positive supply voltage VH. The value of the third positive supply voltage VH coincides with the value of the positive supply voltage of the pre-driving module 60.

The first positive supply voltage VL, the second positive supply voltage VM and the third positive supply voltage VH comply with following relation:

$$VL<VM<VH \tag{1}$$

A second plurality of supply terminals 8 comprises, in the example, a fourth supply terminal 9 for a first negative supply voltage −VL, a fifth supply terminal 10 for a second negative supply voltage −VM and a third supply terminal 11 for a third negative supply voltage −VH.

The first supply terminal 5 is connected to an anode of a first Schottky diode DS1 and the fourth supply terminal 9 is connected to a cathode of a second Schottky diode DS2. The second supply terminal 6 is connected to an anode of a third Schottky diode DS3 and the fifth supply terminal 10 is connected to a cathode of a fourth Schottky diode DS4. As an alternative to Schottky diodes other typologies of damper circuits could be used. The damper circuits permit to avoid, by means of a translation of the direct current level, that a signal exceeds a defined amplitude. In any case, according to the currently available technologies, the Schottky diodes are preferred, due to the fact that they have high switching speed and are less costly and simpler than other damper circuits.

The driving module 70 comprises, according to the example shown, a plurality of pairs of driving transistors in a push-pull configuration, namely, a plurality of Class-B amplifiers with complementary symmetry.

In particular, the driving module 70 comprises a first driving transistor Q1A (for example, of NPN type) and a second driving transistor Q2A (for example, of PNP type), making a first driving push-pull amplifier. Furthermore, the driving module 70 comprises a third driving transistor Q3A (of NPN type) and a fourth driving transistor Q4A (of PNP type), making a second driving push-pull amplifier. The driving module 70 also comprises a fifth driving transistor Q5A (of NPN type) and a sixth driving transistor Q6A (of PNP type), making a third driving push-pull amplifier.

As stated from relation (1), the push-pull pair Q1A-Q2A, is destined to be supplied by an electrical voltage the module of which is lower than that voltage which supplies the push-pull pair Q3A-Q4A, which is lower than that which supplies the push-pull pair Q5A-Q6A.

The first Q1A, third Q3A and fifth driving transistor Q5A each have their own base terminal connected to the second input terminal 4 so as to receive the second input signal Vin. The second Q2A, fourth Q4A and sixth driving transistor Q6A each have their own base terminal connected to the second input terminal 4 so as to receive the second input signal Vin.

The corresponding collector terminal of the first driving transistor Q1A is connected to a first node 12 in turn connected to a cathode of the first Schottky diode DS1, by means of a first regulating resistor Rn1, having a corresponding first resistance also indicated with Rn1. The corresponding collector terminal of the second driving transistor Q2A is connected to a second node 13 in turn connected to an anode of the second Schottky diode DS2, by means of a second regulating resistor Rp1, having a corresponding second resistance also indicated with Rp1.

The corresponding collector terminal of the third driving transistor Q3A is connected to a third node 14 in turn connected to a cathode of the third Schottky diode DS3, by means of a third regulating resistor Rn2, having a corresponding third resistance also indicated with Rn2. The corresponding collector terminal of the fourth driving transistor Q4A is connected to a fourth node 15 in turn connected to an anode of the fourth Schottky diode DS4, by means of a fourth regulating resistor Rp2, having a corresponding fourth resistance also indicated with Rp2.

The corresponding collector terminal of the fifth driving transistor Q5A is connected to a fifth node 16 in turn connected to the third supply terminal 7, by means of a fifth regulating resistor Rn3, having a corresponding fifth resistance also indicated with Rn3. The corresponding collector terminal of the sixth driving transistor Q6A is connected to a sixth node 17 in turn connected to the sixth supply terminal 11, by means of a sixth regulating resistor Rp3, having a corresponding sixth resistance also indicated with Rp3.

The corresponding emitting terminal of the first driving transistor Q1A is connected to an output terminal 18, by means of a first degeneration resistor 19, having a first degeneration resistance Re1. The corresponding emitting terminal of the second driving transistor Q2A is connected to the output terminal 18, by means of a second degeneration resistor 20, having a second degeneration resistance Re2. The output terminal 18 is apt to receive an output signal Vout (of a voltage) from the amplifier 100 and can be connected to the electrical load 1.

The corresponding emitting terminal of the third driving transistor Q3A is connected to the output terminal 18, by means of a third degeneration resistor 21, having the same first degeneration resistance Re1. The corresponding emitting terminal of the fourth driving transistor Q4A is connected to the output terminal 18, by means of a fourth degeneration resistor 22, having the same second resistance Re2.

The corresponding emitting terminal of the fifth driving transistor Q5A is connected to the output terminal 18, by means of a fifth degeneration resistor 23, having the same first degeneration resistance Re1. The corresponding emitting terminal of the sixth driving transistor Q6A is connected to the output terminal 18, by means of a sixth degeneration resistor 24, having the same second resistance Re2.

In particular, the first resistance Rn1 is greater than the third resistance Rn2, which is greater than the fifth resistance Rn3:

$$Rn1 > Rn2 > Rn3 \qquad (2)$$

In particular, the second resistance Rp1 is greater than the fourth resistance Rp2, which is greater than the sixth resistance Rp3:

$$Rp1 > Rp2 > Rp3 \qquad (3)$$

Let us now consider an example of the power module 80, which comprises a first power transistor Q1 (in the example, of PNP type) and a second power transistor Q2 (for example, of NPN type), making a first push-pull power amplifier. Furthermore, the power module 80 comprises a third power transistor Q3 (of PNP type) and a fourth power transistor Q4 (of NPN type), making a second push-pull power amplifier. The power module 80 also comprises a fifth power transistor Q5 (PNP type) and a sixth power transistor Q6 (of PNP type), making a third push-pull power amplifier.

The first Q1, third Q3 and fifth power transistor Q5 each have their own base terminal, respectively connected to the first node 12, third node 14 and fifth node 16. The second Q2, fourth Q3 and sixth power transistor Q6 each have their own base terminal, respectively connected to the second node 13, fourth node 15 and sixth node 17.

The first Q1, third Q3, fifth power transistor Q5 and the second Q2, fourth Q4 and sixth power transistor Q6 each have their own corresponding collector terminal, connected to the output terminal 18.

The corresponding emitting terminal of the first power transistor Q1 is connected to a seventh node 25 placed between the first regulating resistor Rn1 and the cathode of the first Schottky diode DS1. The corresponding emitting terminal of the second power transistor Q2 is connected to an eighth node 26 placed between the second regulating resistor Rp1 and the anode of the second Schottky diode DS2.

The corresponding emitting terminal of the third power transistor Q3 is connected to a ninth node 27 placed between the third regulating resistor Rn2 and the cathode of the third Schottky diode DS3. The corresponding emitting terminal of the fourth power transistor Q4 is connected to a tenth node 28 placed between the fourth regulating resistor Rp2 and the anode of the fourth Schottky diode DS4.

The corresponding emitting terminal of the fifth power transistor Q5 is connected to an eleventh node 29 placed between the fifth regulating resistor Rn3 and the third supply terminal 7. The corresponding emitting terminal of the sixth power transistor Q6 is connected to a twelfth node 30 placed between the sixth regulating resistor Rp3 and the sixth supply terminal 11.

It must be noted that each of following pairs of transistors QiA-Qi:
- first driving transistor Q1A and first power transistor Q1,
- second driving transistor Q2A and second power transistor Q2,
- third driving transistor Q3A and third power transistor Q3,
- fourth driving transistor Q4A and fourth power transistor Q4,
- fifth driving transistor Q5A and fifth power transistor Q5,
- sixth driving transistor Q6A and sixth power transistor Q6, forms a transistor pair with a complementary feedback, also known with the term of "Sziklai pair". A Sziklai pair comprises two bipolar complementary transistors, connected in such a way that the current supplied by a transistor is amplified from the other transistor.

It is clear for a technician skilled in the art that based on preceding description, a Class-G amplifier is realized which comprises Class-AB and non Class-B stages, as shown as an example, and comprises driving transistors and power transistors making corresponding Sziklai pairs.

An example of operation of the amplifier 100 will be described. The following description refers, as an example, to a first positive and increasing input voltage, corresponding to a first input signal Vpre. By increasing the first input voltage Vpre the pre-driving module 60 gives back a second input voltage, namely, the second input signal Vin, which follows the same trend of the first input voltage Vpre.

It should be noted that each of the transistor pairs QiA-Qi cited before acts as a single equivalent transistor in which the base terminal coincides with the base terminal of the corresponding driving transistor QiA, the emitting terminal coincides with the emitting terminal of the corresponding driving transistor QiA (having at least a zero or negligible degeneration resistance) and the collector terminal coincides with the emitting terminal of the corresponding power transistor Qi.

As an example, the pair made of the first driving transistor Q1A and the first power transistor Q1, coincides with a NPN transistor having as a base terminal the second input terminal 4, as emitting terminal the output terminal 18 and as collector terminal the seventh node 25.

The values of the first resistance Rn1, third resistance Rn2 and fifth resistance Rn3 and those of the second resistance Rp1, fourth resistance Rp2 and sixth resistance Rp3 permit to fix the activation thresholds of the corresponding equivalent transistors QiA-Qi.

Until the second input voltage Vin increases, but remains lower than the value of the first positive supply voltage VL, the first driving transistor Q1A, third driving transistor Q3A and fifth driving transistor Q5A are turned on and adsorb a corresponding current (approximately the same current). In such situation, the first power transistor Q1 is also turned on whereas the third power transistor Q3 and fifth power transistor Q5 are off.

The situation described before occurs due to the fact that the value of the first resistance Rn1 is such that the electrical voltage at the base terminal of the first driving transistor Q1 is sufficiently low (with respect to the emitting potential) so as to cause its activation (the potential difference between emitter and base Veb is greater than the threshold voltage), by initially taking it to the active region.

As a contrary, the values of the third resistance Rn2 and fifth resistance Rn3 (which follow the relation (2)) are such that the voltages of the base terminals, of the third power transistor Q3 and fifth power transistor Q5 respectively, keep such transistors in interdiction.

Let Vth be the threshold voltage indicated of a pn junction of the driving transistors Q1-Q6 of the amplifier 100, and Ic the collector current substantially affecting the first driving transistor Q1A, third driving transistor Q3A and fifth driving transistor Q5A, in the situation described before.

In this situation, it is noted that the base-emitter voltage VBE(1)=Rn1 Ic is greater than the threshold value Vth, for the first driving transistor Q1A.

The base-emitter voltage VBE(3)=Rn2 Ic for the third power transistor Q3 is smaller than the threshold value Vth and the base-emitter voltage VBE(3)=Rn3 Ic, for the third power transistor Q3, is lower than the threshold value Vth and therefore such transistors remain nonconducting.

Then, the pair made of the first driving transistor Q1A and the first power transistor Q1, supplied by the first positive supply voltage VL through the first Schottky diode DS1, supplies the current to the electrical load 1 so bringing the output terminal 18 to a corresponding value of the output voltage Vout.

As the positive value of the second input voltage Vin increases, at in particular when it approaches the first positive supply voltage VL, the first driving transistor Q1A is gradually brought at saturation and its collector current is reduced, whereas the collector current increases, affecting the third driving transistor Q3A.

So the third driving transistor Q3A gradually enters the active region whereas the first driving transistor Q1A gradually moves towards nonconduction. Also the collector current of the first power transistor Q1 decreases.

In this initial switching phase, the current affecting the first Schottky diode DS1 decreases, whereas in a complementary way the current increases crossing the third Schottky diode DS3. Until the first Schottky diode DS1 does not take an inverted polarization condition, the output voltage Vout substantially follows the trend of the second input voltage Vin unless a limited "clamping" effect which reduces its positive slope.

When the second input voltage Vin exceeds the first positive supply voltage VL the first driving transistor Q1A is completely off (namely, nonconducting) whereas the third driving transistor Q3A conducts more current than before; the low practically zero current crossing the first resistor Rn1 makes that the first power transistor Q1 nonconducting whereas the increase of the current crossing the first regulating transistor Rn3 makes the third power transistor Q3 turn on. During the activation of the third power transistor Q3 a "recovery"-phase occurs of this power transistor Q3.

It should be noted that the fifth resistance Rn3, following the relation (2), has such a value as to permit that the third power transistor Q3 turn on when the second input voltage Vin exceeds the first positive supply voltage VL.

Once having performed such switching and until the second input voltage Vin is lower than the second positive supply voltage VM, the pair made of the third driving transistor Q3A and the third power transistor Q3, supplied by the second positive supply voltage VM by means of the third Schottky diode DS3, supplies the current to the electrical load 1 so as to bring the output terminal 18 to a corresponding value of the output voltage Vout.

In this condition, the first driving transistor Q1A, the first power transistor Q1 and the second power transistor Q2 are nonconducting.

A second switching phase occurs when the second input voltage Vin approaches or exceeds the second positive supply voltage NM and is similar to that described before. In this case, once having performed the second switching, the pair made of the fifth driving transistor Q5A and the fifth power transistor Q5, supplied by the third positive supply voltage VH, supplies the current to the electrical load 1 so as to bring the output terminal 18 to a corresponding value of the output voltage Vout.

The Applicant notes that the amplifier 100 has great advantages, in relation to the switching noise, with respect to amplifiers made according to a known technique. With reference to that, the Applicant has made computer simulations in order to compare an amplifier similar to the amplifier 100 described before, with a conventional Class-G amplifier having stacked topology and with a conventional Class-G amplifier having shunt topology, both configured in a similar way with respect to the amplifiers described in the article of D. H. Horrocks—Active filter power dissipation reduction using improved output stage—Digital and Analog Filters and Filtering Systems, IEE Colloquium on, 25 May 1990, described before.

Figure 2A:
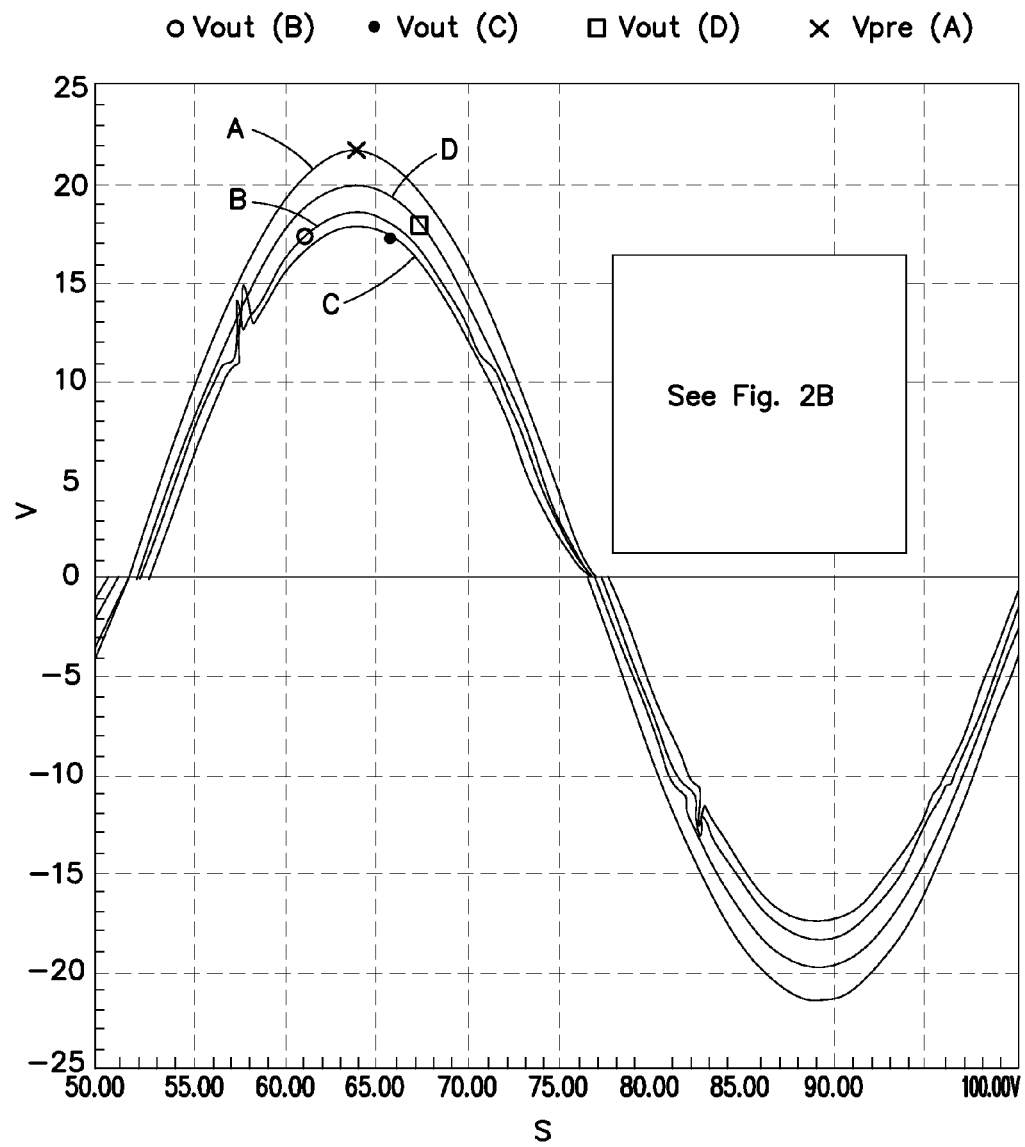
FIGS. 2A and 2B show some curves relative to simulations made in order to compare said Class-G amplifier with amplifiers of known type.
Figure 2B:
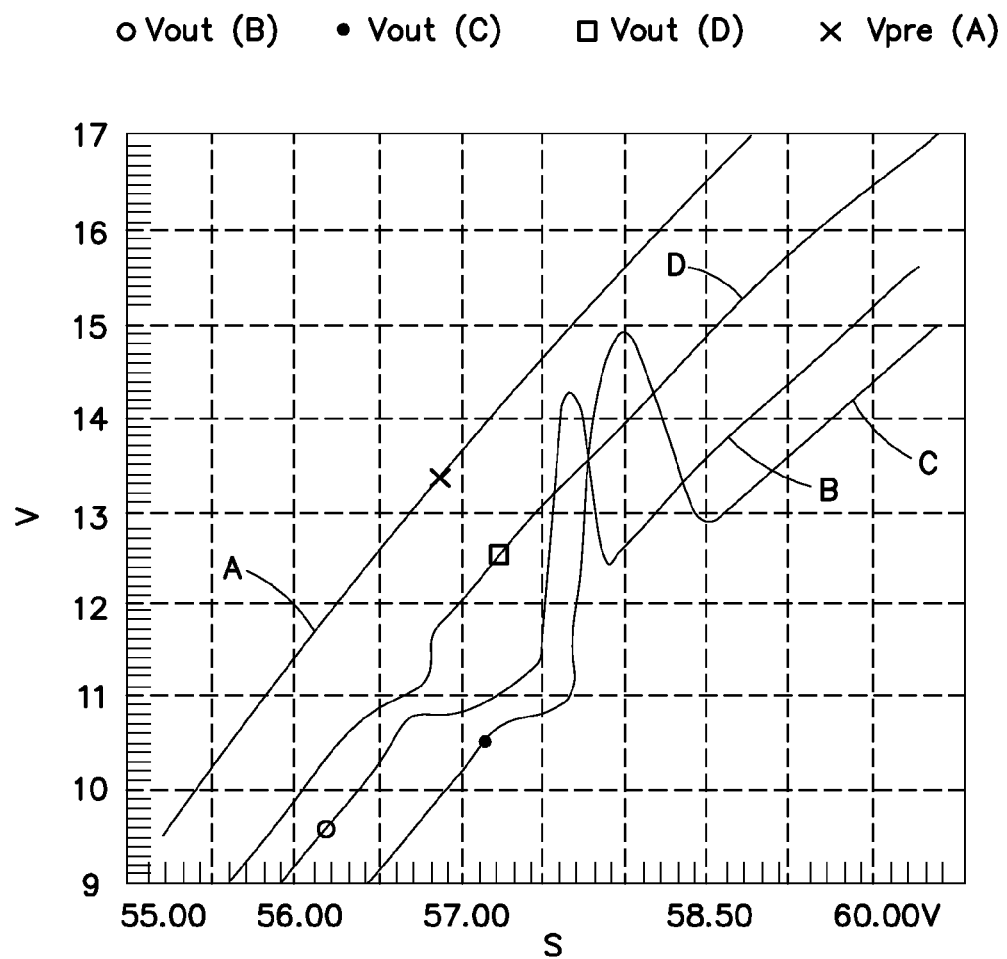

The results of such simulation are shown in FIGS. 2A and 2B, which show:
a first curve A corresponding to a first input signal Vpre, namely to an electrical sinusoidal voltage;
a second curve B corresponding to a first output comparison voltage Vout(B) obtainable by means of a Class-G amplifier of conventional type in the shunt configuration having as an input the first input signal Vpre;
a third curve C corresponding to a second output voltage Vout(C) obtainable by means of a Class-G amplifier of the conventional type in the stacked configuration having at the input the first input signal Vpre;
a fourth curve D corresponding to the output voltage Vout(A) obtainable with an amplifier similar to the amplifier 100 described before, having at the input the first input signal Vpre.

Furthermore, FIGS. 2A and 2B show in a lateral region, a magnification of the trends of the curves A-D listed before and corresponding to the switching phase from an amplifying stage with a lower supply voltage towards an amplifying stage with greater supply voltage.

With reference to the second curve B and the third curve C, regarding conventional techniques, the presence of switching noise should be observed. In particular, the switching noise has a "clamping" effect of the voltage and a "bump" effect of the voltage.

The clamping effect occurs with a decrease of the first comparison output voltage Vout(B) and of the second comparison output voltage Vout(C). Such clamping occurs during a turn off phase of the transistors corresponding to the amplifying stage at a lower voltage.

As it can be appreciated from the analysis of the fourth curve D, it presents an extremely reduced clamping effect in comparison with what occurs in the second curve B and the third curve C. These better performances of the amplifier 100 with respect to those of the conventional amplifiers can be attributed to a linearization introduced by the local retroaction associated with the use of the Sziklai pairs.

With reference to the bump effect, this occurs with a pulse superimposed on the first output comparison voltage Vout(B) and to the second comparison output voltage Vout(C). Such pulse occurs when in the recovery phase, the amplifier stage begins to turn on of the amplifier supplied by the voltage greater than that used before the switching.

This pulse is due to the "charge storage" in the base of the power transistor which is being turned on as a consequence of the switching and its amplitude and duration are inversely proportional to the speed with which the excess charge storage is evacuated. Such evacuation speed of the excess charge is a function of the "storage time" of the power transistors.

It should be observed that in the fourth curve D, corresponding to the amplifier 100, no pulse is present typical of the recovery phase of the amplifiers made according to the known technique. The use of a Sziklai pair reduces this pulse which occurs thanks to its linearization effect.

Furthermore, it has been observed that the Skizlai pair has an activation threshold (in particular the activation of the corresponding power transistor Qi) which is not critically dependent on the value of its own regulation resistance, as for example, the resistances Rn1, Rn2 ed Rn3 and the resistances Rp1, Rp2 ed Rp3. That means that regulation resistances can be used having non-optimal values without altering the function of the amplifier 100. This permits, as indicated in relations (2) and (3), to reduce the value of the regulating resistance of the stages having a supply voltage greater than the stages having a smaller supply voltage. By reducing the value of the regulating resistance also the storage time of the corresponding power transistor Q1-Q6 is reduced, with a consequent reduction of the bump effect.

It should be observed that the degeneration resistances Re1 and Re2, present on the corresponding emitting terminals of the driving transistors Q1A-Q6A, have the advantage of limiting the base current of the corresponding power transistor Q1-Q6, so as to limit the "charge storage" and making the subsequent "recovery" phase more rapid and free of pulse noise at the output.

Therefore the simulations have shown a remarkable reduction of the switching noise obtainable with the amplifier 100.

This result has also the advantage, that it permits the use in the amplifier 100 of non particularly quick power transistors Q1-Q6, namely, for example, having a transition frequency of approximately 3 Mhz so as to avoid the use of quicker and more expensive transistors, namely, having a transition frequency of some tens of Mhz.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:
1. A Class-G amplifier, comprising:
a first and second driving transistor configured to receive an input voltage;
a first supplying terminal connected to the first driving transistor to supply a first supplying voltage;
a second supplying terminal connected to the second driving transistor to supply a second supplying voltage having an absolute value higher than said first voltage;
a first power transistor connected to the first driving transistor to form a first Sziklai transistor pair with complementary feedback and being structured to be activated by a first input voltage having an absolute value lower than the first supplying voltage;
a second power transistor connected to the second driving transistor to form a second Sziklai transistor pair with complementary feedback and being structured to be activated by an input signal comprised between the first supplying voltage and the second supplying voltage.
2. An amplifier according to claim 1, further comprising:
a first regulating resistor having a first regulating resistance and connected to said first Sziklai transistor pair so that a first activation threshold of the first Sziklai transistor pair is dependent from said first resistance;
a second regulating transistor having a second regulating resistance lower than said first regulating resistance and connected to said second Sziklai transistor pair so that a second activation threshold of the second Sziklai transistor pair is dependent from said second resistance; and
an output terminal for an output signal related to said input signal and electrically connected to a corresponding terminal of said collector of said first power transistor and of said second power transistor.

3. An amplifier according to claim 2, in which:
the first regulating resistor is connected between a base terminal and an emitter terminal of said first power transistor;
the second regulating transistor is connected between a base terminal and an emitter terminal of said second power transistor.

4. An amplifier according to claim 2, further comprising:
a first degeneration resistor connected between an emitter terminal of said first driving transistor and said output terminal; and
a second degeneration resistor connected between an emitter terminal of said second driving transistor and said output terminal.

5. An amplifier according to claim 2, further comprising:
a clamping circuit connected between the first supplying terminal and said first regulating resistor.

6. An amplifier according to claim 5, in which:
the clamping circuit comprises a first supplying diode having a first diode terminal connected to the first supplying terminal and a second diode terminal connected to the first regulating resistor.

7. An amplifier according to claim 2, in which said first diode is a Schottky diode.

8. An amplifier according to claim 3, in which:
the first power transistor has a corresponding collector terminal connected to the output terminal; and
the first driving transistor has a corresponding collector terminal connected to the base terminal of the first power transistor.

9. An amplifier according to claim 1, further comprising a pre-driving stage configured to receive a voltage to amplify and to supply such input voltage.

10. An amplifier according to claim 1, in which the first driving transistor is of Class-B and the second power transistor is of Class-B.

11. An amplifier according to claim 1, further comprising:
a second driving transistor connected to the first driving transistor in a push-pull configuration; and
a second power transistor connected to the first power transistor in a push-pull configuration.

12. An amplifier according to claim 1, further comprising a pre-amplifier module structured to receive a signal to be amplified and to supply said input signal.

13. An amplifier according to claim 1, in which said driving and power transistors are bipolar transistors.

14. An amplifier according to claim 1, wherein the input voltage corresponds to an audio electric signal.

15. An audio system comprising:
a loudspeaker provided with an input for an amplified electric signal;
a Class-G amplifier configured to supply said amplified electric signal, comprising:
a first and second driving transistor configured to receive an input voltage, a first supplying terminal connected to the first driving transistor to supply a first supplying voltage, a second supplying terminal connected to the second driving transistor to supply a second supplying voltage having an absolute value greater than said first voltage;
a first power transistor connected to the first driving transistor to form a first Sziklai transistor pair with complementary feedback and being structured to be activated by an input voltage having an absolute value lower than the first supplying voltage;
a second power transistor connected to the second driving transistor to form a second Sziklai transistor pair with complementary feedback and being structured to be activated by an input signal comprised between the first supplying voltage and the second supplying voltage.

16. The audio system of claim 15 wherein said Class-G amplifier further comprises:
a first regulating resistor having a first regulating resistance and connected to said first Sziklai transistor pair so that a first activation threshold of the first Sziklai transistor pair is dependent from said first resistance;
a second regulating transistor having a second regulating resistance lower than said first regulating resistance and connected to said second Sziklai transistor pair so that a second activation threshold of the second Sziklai transistor pair is dependent from said second resistance; and
an output terminal for an output signal related to said input signal and electrically connected to a corresponding terminal of said collector of said first power transistor and of said second power transistor.

17. The audio system of claim 16 wherein the first regulating resistor is connected between a base terminal and an emitter terminal of said first power transistor, and the second regulating transistor is connected between a base terminal and an emitter terminal of said second power transistor.

18. The audio system of claim 16 wherein said Class-G amplifier further comprises:
a first degeneration resistor connected between an emitter terminal of said first driving transistor and said output terminal; and
a second degeneration resistor connected between an emitter terminal of said second driving transistor and said output terminal.

19. The audio system of claim 15 wherein said Class-G amplifier further comprises a clamping circuit connected between the first supplying terminal and said first regulating resistor.

20. The audio system of claim 15 wherein said Class-G amplifier further comprises a pre-driving stage configured to receive a voltage to amplify and to supply such input voltage.

* * * * *